US010164081B2

(12) United States Patent
Morvan (10) Patent No.: US 10,164,081 B2
(45) Date of Patent: Dec. 25, 2018

(54) METHOD FOR FORMING AN IMPLANTED AREA FOR A HETEROJUNCTION TRANSISTOR THAT IS NORMALLY BLOCKED

(71) Applicant: COMMISSARIAT A L'ENERGIE ATOMIQUE ET AUX ENERGIES ALTERNATIVES, Paris (FR)

(72) Inventor: Erwan Morvan, Montagne (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/787,623

(22) PCT Filed: Apr. 18, 2014

(86) PCT No.: PCT/EP2014/058027
§ 371 (c)(1),
(2) Date: Oct. 28, 2015

(87) PCT Pub. No.: WO2014/177407
PCT Pub. Date: Nov. 6, 2014

(65) Prior Publication Data
US 2016/0104791 A1    Apr. 14, 2016

(30) Foreign Application Priority Data

Apr. 30, 2013   (FR) ...................... 13 54000

(51) Int. Cl.
*H01L 29/778*   (2006.01)
*H01L 29/66*    (2006.01)
(Continued)

(52) U.S. Cl.
CPC ...... *H01L 29/7787* (2013.01); *H01L 21/0254* (2013.01); *H01L 21/02609* (2013.01);
(Continued)

(58) Field of Classification Search
None
See application file for complete search history.

(56) References Cited

U.S. PATENT DOCUMENTS 8,030,660 B2 * 10/2011 Saito ............... H01L 29/7787
                                                      257/192
8,455,920 B2 *  6/2013 Bridger ............ H01L 29/0692
                                                      257/194
(Continued)

FOREIGN PATENT DOCUMENTS

EP    2 455 964 A1    5/2012
JP    08-153892 A     6/1996
(Continued)

OTHER PUBLICATIONS

Maojun Wang, et al., "Improvement of the Off-State Breakdown Voltage With Fluorine Ion Implatantation in AlGaN/GaN HEMTs," IEEE Transactions on Electron Devices, vol. 58, No. 2, XP011343588, Feb. 1, 2011, pp. 460-465.

(Continued)

*Primary Examiner* — Tom Thomas
*Assistant Examiner* — Nilufa Rahim
(74) *Attorney, Agent, or Firm* — Oblon, McClelland, Maier & Neustadt, L.L.P.

(57) ABSTRACT

The invention relates to a method for manufacturing a heterojunction transistor (1), said method comprising the steps of: forming an implanted area (8) by ionically implanting magnesium, calcium, zinc, or fluorine in a first gallium nitride semiconductor layer (4), having a hexagonal crystalline structure, in the [0 0 0 1] orientation of said crystalline structure; forming a second semiconductor layer (6) on the first semiconductor layer so as to form an electron gas layer (5) at the interface between the first and second layers;

(Continued)

and forming a control gate (75) over the second conductive layer (6) and vertically in line with the implanted area (8).

18 Claims, 6 Drawing Sheets

(51) Int. Cl.
| | |
|---|---|
| H01L 29/04 | (2006.01) |
| H01L 29/10 | (2006.01) |
| H01L 21/02 | (2006.01) |
| H01L 21/265 | (2006.01) |
| H01L 21/324 | (2006.01) |
| H01L 29/20 | (2006.01) |
| H01L 29/205 | (2006.01) |
| H01L 29/207 | (2006.01) |

(52) U.S. Cl.
CPC .. *H01L 21/02694* (2013.01); *H01L 21/26546* (2013.01); *H01L 21/3245* (2013.01); *H01L 29/045* (2013.01); *H01L 29/1029* (2013.01); *H01L 29/2003* (2013.01); *H01L 29/205* (2013.01); *H01L 29/207* (2013.01); *H01L 29/66462* (2013.01)

(56) References Cited

U.S. PATENT DOCUMENTS

| | | | | |
|---|---|---|---|---|
| 2001/0004332 | A1* | 6/2001 | Eitan | G11C 11/5671 |
| | | | | 365/200 |
| 2006/0060871 | A1* | 3/2006 | Beach | H01L 29/0623 |
| | | | | 257/94 |
| 2007/0228416 | A1 | 10/2007 | Chen et al. | |
| 2007/0278518 | A1* | 12/2007 | Chen | H01L 29/66462 |
| | | | | 257/192 |
| 2007/0278521 | A1 | 12/2007 | Ishida et al. | |
| 2007/0295993 | A1* | 12/2007 | Chen | H01L 29/2003 |
| | | | | 257/194 |
| 2010/0084687 | A1* | 4/2010 | Chen | H01L 29/207 |
| | | | | 257/194 |
| 2011/0263102 | A1* | 10/2011 | Heikman | H01L 29/7787 |
| | | | | 438/478 |
| 2012/0122281 | A1 | 5/2012 | Chang et al. | |
| 2012/0153390 | A1 | 6/2012 | Mishra et al. | |
| 2012/0168719 | A1 | 7/2012 | Ikuta et al. | |
| 2014/0239307 | A1* | 8/2014 | Dargis | H01L 21/02192 |
| | | | | 257/76 |

FOREIGN PATENT DOCUMENTS

| | | |
|---|---|---|
| JP | 2001-185717 A | 7/2001 |
| JP | 2003-31798 A | 1/2003 |
| JP | 2004-95640 A | 3/2004 |
| JP | 2007-103451 A | 4/2007 |
| JP | 2008-227501 A | 9/2008 |
| JP | 2010-010584 A | 1/2010 |
| JP | 2010-245504 A | 10/2010 |
| WO | 2010/038150 A1 | 4/2010 |
| WO | WO 2011/155199 A1 | 12/2011 |

OTHER PUBLICATIONS

Tao Long, et al., "High Surface Hole Concentration P-type GaN Using Mg Implantation," Acta Scientiarum Naturalium Universitatis Pekinensis, vol. 37, No. 5, XP008166378, Sep. 1, 2001, pp. 701-704.

International Search Report dated Jul. 21, 2014 in PCT/EP2014/058027 filed Apr. 18, 2014.

Office Action dated Jan. 16, 2018 in the corresponding Japanese Patent Application No. 2016-510999 (with English Translation) citing documents AA, AB and AO-AT therein 22 pages.

* cited by examiner

METHOD FOR FORMING AN IMPLANTED AREA FOR A HETEROJUNCTION TRANSISTOR THAT IS NORMALLY BLOCKED

The invention relates to power transistors, and in particular high electron mobility heterojunction power transistors employing GaN semiconductor layers.

Operation at increasingly higher frequencies is or will be required by many current or future electronic applications. These applications are not limited to the telecommunications market. Switches in high frequency ranges are also necessary in on-board electronics intended for cars and ground-based means of transportation, aeronautical and medical systems or in-home automation solutions, for example. These applications for the most part require high-power switches (typically between 500 V and several kilovolts, with currents most often comprised between 10 and 200 A) functioning in frequency ranges that may reach and even exceed one megahertz.

Historically, high-frequency power switches have for a long time used field-effect transistors based on a semiconductor channel (power MOSFETs). At lower frequencies, junction transistors (thyristors, IGBTs etc.) are preferred because they are able to withstand higher current densities. However, because of the relatively limited breakdown voltage of each of these transistors, power applications require many transistors to be connected in series. These series transistors generate substantial losses, both in the steady-state and switching regimes.

An alternative to high-frequency power switches is the use of high-electron mobility transistors (HEMTs), also denoted by the term heterostructure field-effect transistors (HFETs). Such transistors include a superposition of two semiconductor layers having different bandgaps, forming a potential well at their interface. Electrons are confined to this well and form a two-dimensional electron gas. For reasons of voltage and temperature withstand, these transistors are chosen to have a wide energy bandgap.

Among wide energy bandgap HEMT transistors, transistors based on gallium nitride are very promising. The width of their energy bandgap results in a higher critical electric field, compared to conventional electronic materials (Si, SiGe, GaAs, InP), in a high carrier saturation velocity, and in good thermal and chemical stability (enabling use in extreme environments). The breakdown field of gallium nitride (GaN) may thus be higher than $2\times10^6$ V/cm, thereby easily allowing compact transistors with breakdown voltages higher than 100 V to be produced (500 nm of GaN is sufficient). In addition, such transistors allow very high current densities to be obtained because of the very high electron mobility and high electron density in the interface gas.

Gallium nitride has a wide energy bandgap of 3.39 eV. In addition, ternary alloys such as AlGaN, InAlN or InGaN may easily be produced in a tool for forming GaN by epitaxy. A HEMT transistor based on gallium nitride may also be produced on a silicon substrate (which is the basic substrate of the semiconductor industry). GaN HEMT transistors are therefore much less expensive to produce than transistors based on SiC for example. Although SiC-based transistors also have a wide energy bandgap, heterojunctions can be difficult to produce with this material, and it cannot be produced on a standard silicon substrate given the temperatures required for epitaxial growth, thereby making its fabrication cost prohibitive and greatly limiting its applications.

For certain applications, especially with a view to isolating a circuit in case of a malfunction of a control system, normally-off or enhancement mode transistors are used, i.e. transistors with a positive switching threshold voltage, so that the transistor remains turned off in the absence of a control signal.

Because of the intrinsically conductive nature of the electron gas layer formed between a source and a drain, it is technologically easier to produce a depletion mode or normally-on type heterojunction transistor. However, a number of fabrication processes have been developed with a view to forming enhancement mode heterojunction transistors.

Figure 1:
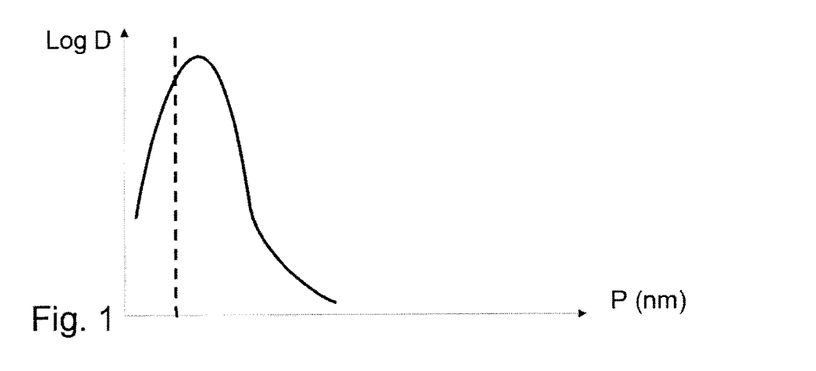
FIG. 1 is an example of a graph for ion implantation at an inclination guaranteeing an implantation profile with a certain precision.

According to a first approach, a binary layer of gallium nitride GaN is produced by epitaxy, then a ternary AlGaN layer is produced by epitaxy in order to form a heterojunction and an electron gas layer at the interface between these layers. Next, p-type dopants in the form of magnesium are implanted at high energy (more than 100 keV) so as to form an implanted zone in the GaN layer. A high implantation energy is required to achieve a satisfactory implantation depth. Since the implanted zone formed has an effect on threshold voltage, the depth and concentration of the dopant must be defined with the highest possible precision. In order to precisely control the dopant profile, this implantation is carried out at a very precise inclination to the normal to the AlGaN layer, in order to avoid implanting along one of the axes of channeled implantation of the material. The implantation may thus be arranged at a depth controlled to within a few hundred nanometers under the interface between the GaN and AlGaN, because of interactions with the crystal structure. An example of an implantation profile is illustrated in FIG. 1: the implantation profile thus has a substantially Gaussian distribution depthwise.

The zone implanted with magnesium is then activated with a high temperature anneal, the magnesium being substituted for the group-III element in the crystal lattice of the GaN. Once the implanted zone has been activated, the electric field generated by the implanted zone allows an insulating zone (depleted of carriers) to be created plumb therewith, at the interface between the GaN layer and the AlGaN layer. Thus, the electron gas is depleted at the heterojunction, until a positive threshold voltage is applied.

The high-energy implantation step induces crystal defects in the structure of the GaN layer and of the AlGaN layer. These crystal defects are difficult to remove. They disrupt activation of the implanted dopant (and therefore alter the threshold voltage of the transistor) and decrease electron mobility at the heterojunction. Residual crystal defects may also form electronic states in the bandgap of the semiconductor and engender a trapping effect of carriers that disrupts operation of the transistor (dynamic conduction resistance effect).

According to a second approach, document WO 2005/070009 describes a fabrication process in which:
a first GaN layer is formed by epitaxy;
the p-doped implanted zone is formed at high-energy in the first GaN layer;
a second GaN layer is formed by epitaxy on the implanted zone and the first GaN layer;
an AlGaN layer is formed by epitaxy on the second GaN layer;
a gate is formed on the AlGaN layer plumb with the implanted zone.

However, the transistor thus obtained has drawbacks. Specifically, the first GaN layer also contains crystal defects with the aforementioned consequences.

Hybrid heterojunction/MOSFET transistors are also known. Their fabrication process includes forming by epitaxy a binary layer of gallium nitride GaN followed by a ternary layer of AlGaN in order to form a heterojunction and an electron gas layer at the interface between these layers. A gate trench is then etched through the AlGaN layer as far as the GaN layer. The electron gas layer is therefore interrupted level with the gate trench. Next, p-type dopants in the form of magnesium are implanted at high energy (more than 100 keV) in order to form an implanted zone in the GaN layer at the bottom of the gate trench. An oxide layer is then deposited to cover the walls and the bottom of the gate trench. A stack of layers is then deposited in the trench. Thus a p-doped semiconductor well is provided plumb with the gate. Conductive junctions through the electron gas layer between the channel on the one hand and the source and drain on the other hand are also provided. The high-energy implantation step again induces crystal defects in the zone of implantation of the magnesium of the GaN layer.

The invention aims to solve one or more of these drawbacks. The invention thus relates to a fabrication or production process of a heterojunction transistor such as defined in the appended claims.

Other features and advantages of the invention will become more clearly apparent from the completely nonlimiting description that is given thereof below by way of indication and with reference to the appended drawings, in which:

FIGS. 2 to 5 are schematic cross-sectional views of a heterojunction field-effect transistor 1, during various steps of an example of a fabrication process according to the invention.

Figure 2:
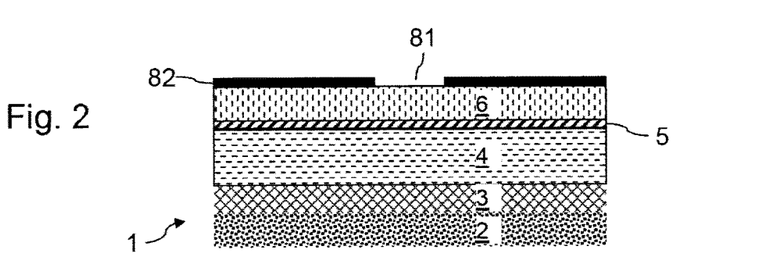
FIGS. 2 to 5 are cross-sectional views of a heterojunction field-effect transistor during various steps of one example of a production process according to the invention.

FIG. 2 shows an unfinished transistor 1 comprising a substrate 2, a buffer layer 3 placed on the substrate 2, a first semiconductor layer 4 made of gallium nitride GaN placed on the buffer layer 3, a second semiconductor layer 6 of III-V type placed on the layer 4, and a mask 82 placed on the layer 6. An electron gas is intrinsically formed by the heterojunction at the interface between the layer 6 and the layer 4. For the sake of legibility, the electron gas is illustrated in the form of a layer 5 at the interface between the layer 4 and the layer 6. An aperture 81 is arranged in the mask 82.

The substrate 2 may be an insulator or be made of intrinsic or doped silicon. The substrate 2 is typically (111)-orientated silicon used preferably as detailed below. The substrate 2 may typically have a thickness of about 650 µm to 1 mm.

The buffer layer 3 deposited on the substrate 2 serves as an intermediary between this substrate and the GaN first layer 4, in order to allow lattice matching between the substrate 2 and this layer 4 and to control mechanical stresses in this layer 4.

The layer 4 may typically have a thickness comprised between 100 nm and 5 µm. The layer 4 may be formed in a way known per se by epitaxy on the buffer layer 3. The epitaxy is carried out so that the layer 4 formed has a hexagonal crystal structure with a [0001] direction making a normal to the upper surface of the substrate 2. Use of a (111)-oriented silicon substrate 2 promotes epitaxial growth of the layer 4, because of the better matching lattice parameters.

The layer 6 is typically formed by vapor phase epitaxy on the second layer 4. The layer 6 is generally designated by the term "barrier". The layer 6 is typically a ternary group-III nitride alloy, for example AlGaN, or a binary group-III nitride alloy, for example AlN. A layer 6 made of AlGaN is particularly appropriate for a layer 4 made of GaN, the growth of the layer 6 by epitaxy then simply being achieved by keeping the transistor 1 in the same tool and performing an epitaxial growth step while introducing an additional aluminum precursor into the gas mixture relative to the epitaxial growth conditions of the layer 4. The epitaxial growth of such a layer 6 made of AlGaN is advantageously carried out so that the latter has a hexagonal crystal structure with a [0001] direction making a normal to the upper surface of the substrate 2. The respective [0001] directions of the layers 4 and 6 are thus coincident. The layer 6 has a thickness comprised between 5 nm and 40 nm, a thickness of 25 nm for example. Although not illustrated, the layer 6 may comprise a 1 to 3 nm-thick layer of a binary group-III nitride alloy formed on the layer 4, this layer of binary alloy being covered with another layer of a ternary group-III nitride alloy.

Figure 3:
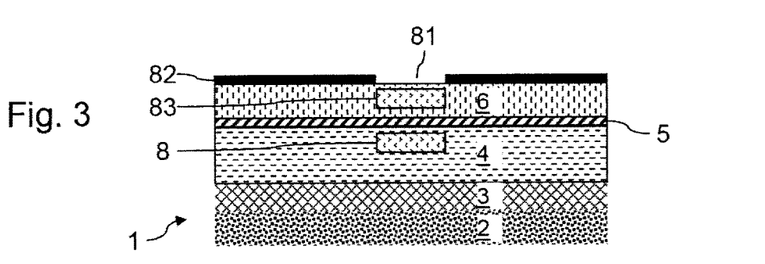

In FIG. 3, dopants have been implanted into the layer 4 through the aperture 81. The implantation is carried out by ion implantation of magnesium, calcium, zinc (which are p-type dopants) or fluorine (a highly electronegative element). Two implanted zones of high concentration are formed during this implantation: an implanted zone 8 in the layer 4 and an implanted zone 83 in the layer 6. The ion implantation is carried out in line with the [0001] direction of the crystal structure of the layers 4 and 6. Because of this implantation direction, the ions that reach the layer 4 are channeled ions. Trials have shown that a channeled implantation is obtained with an ion implantation having an orientation making an angle smaller than or equal to 2°, preferably an angle smaller than or equal to 1.5°, and advantageously an angle smaller than or equal to 1° to the [0001] direction of the crystal structure of the layers 4 and 6. Thus, it is possible to obtain a channeled implantation even with an imprecision in the orientation of the implantation or even with an imprecision relative to the [0001] direction of the crystal structure formed for the layers 4 and 6.

Figure 6:
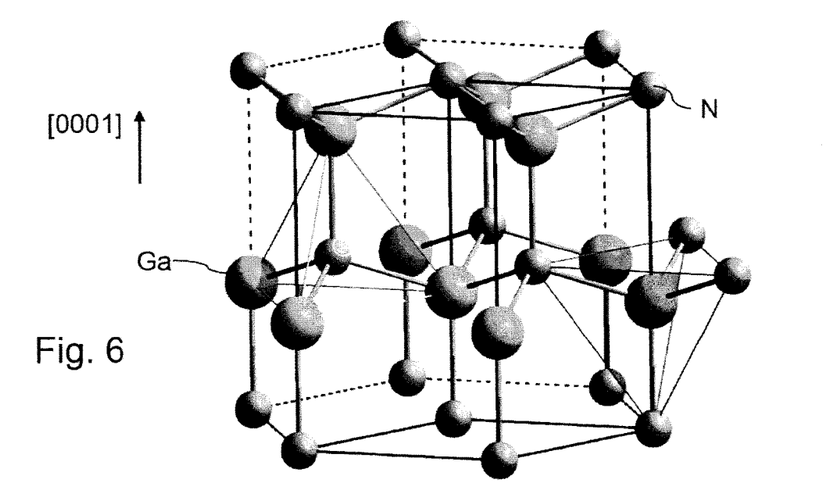
FIG. 6 is a perspective view of a hexagonal GaN crystal structure.

FIG. 6 is a schematic perspective view of the hexagonal crystal structure of the GaN layer 4. The crystal structure of the GaN forms crystal channels so to speak in which the interaction with the implanted ions is minimal, allowing them to be implanted to a large depth for a given energy. In addition, GaN has a relatively high atomic density, inducing a high atomic density concentrated on the periphery of the crystal channels, thereby promoting guidance of the channeled ions.

Such an implantation mode is used here whereas it has been avoided in the prior art because a lack of control of the implantation profile results. Such a depthwise-channeled implantation is particularly advantageous with ions of magnesium, calcium, zinc or fluorine: these ions have a particular atomic number that leads to a low level of interaction with the electrons of the atoms of the crystal structure during their passage through the crystal channels. Channeled implantation of such ions greatly decreases the amount of crystal defects generated in the crystal structure of the GaN of the layer 4, relative to an implantation according to the prior art. For a given ion implantation depth, a relatively low implantation energy may be used. Such an implantation also degrades to a lesser extent the conduction properties of the electron gas layer 5. The use of magnesium ions proves to be particularly advantageous. Specifically, for a given implantation energy, the implantation depth of magnesium with a channeled implantation is several tens of times larger than the implantation depth obtained with an inclined implantation according to the prior art.

Figure 7:
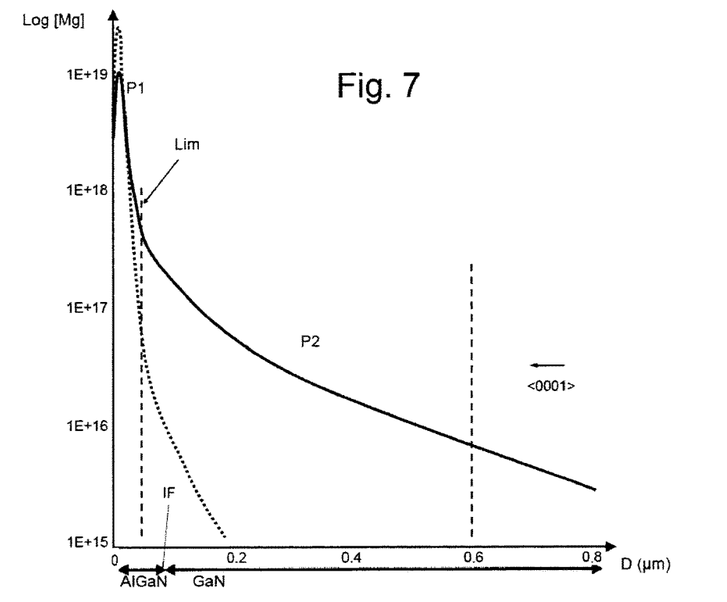
FIG. 7 is an example of a magnesium ion implantation graph obtained after a step of the fabrication process of the transistor.

FIG. 7 is an example of a graph illustrating magnesium dopant concentration as a function of depth, after the implantation step, and as a function of angle to the [0001] direction of the crystal structure of the layer 4. Here the implantation was carried out with an energy of 5 keV.

The dotted curve corresponds to an implantation with an angle of 7° to the [0001] direction of the crystal structure of the layer 4, corresponding to a prior art method.

The solid curve corresponds to an implantation with an angle of 0° to the [0001] direction of the crystal structure of the layer 4, corresponding to an implementation of the invention.

With the implementation according to the invention, a Gaussian type implantation is produced in a region P1 (here over a depth of about 40 nm). One portion of this implantation may be explained by an interaction of some of the ions with atoms as they enter the crystal structure (small impact parameter collisions with surface atoms), by crystal defects, by a native oxide layer, and by thermal vibrations of atoms of the crystal. This implantation generates the implanted zone 83 in the layer 6.

Such an implantation region P1 may be observed with an implantation energy comprised between 1 and 10 keV for example. This implantation region will possibly correspond substantially to the thickness of the layer 6 of AlGaN (with for example a depth of the peak of the region P1 at 14 nm for 10 keV) or be of a smaller thickness than the layer 6.

Deeper in the region P1, the implantation concentration drops sharply with distance from the peak. Deeper still (here beyond 40 nm), a region P2 is observed starting at an inflection point in the graph, illustrated by the reference Lim. The implantation concentration gradually decreases in the region P2. Relative to the total dose of dopants introduced during the implantation, 30 to 40% of said dopants are implanted between 40 and 600 nm (zone bounded by the two dashed lines in the graph). Therefore, despite a relatively low implantation energy being used, a non-negligible amount of dopants is implanted at depth in the layer 4 and with a profile that is easy to control. In the example illustrated, a non-negligible dopant concentration (typically higher than or equal to $5\times10^{15}$ cm$^{-3}$) is observed to a depth of about fifty times the depth of the peak of the region P1. Advantageously, at least 30% of the amount of dopant implanted is distributed in a region P2 the thickness of which is at least three times that of the region P1. Because of the low usable implantation energy, the implantation in the layer 4 generates a smaller number of crystal defects.

The region P1 advantageously has a thickness smaller than or equal to that of the layer 6. The layer 5 (here represented by the interface IF) is then advantageously located in the zone P2.

The respective concentrations of the regions P1 and P2 depend on the energy of the implantation dose, on the fault density in the epitaxial layers, on the native oxide layer and on the temperature during implantation.

The implanted zone 8 thus formed advantageously has a thickness comprised between 15 and 800 nm. The implanted zone 8 will possibly have a maximum magnesium dopant concentration comprised between $10^{16}$ and $10^{19}$ cm$^{-3}$. The p-type background or non-intentional dopant concentration in GaN layers is usually about $10^{15}$ cm$^{-3}$. The magnesium dopant concentration in the implanted zone 8 is thus sufficiently high in proximity to the interface IF to have an influence on the electron density at this interface IF (depletion for the off state) and sufficiently low not to perturb the mobility of these electrons (on state).

Figure 17:
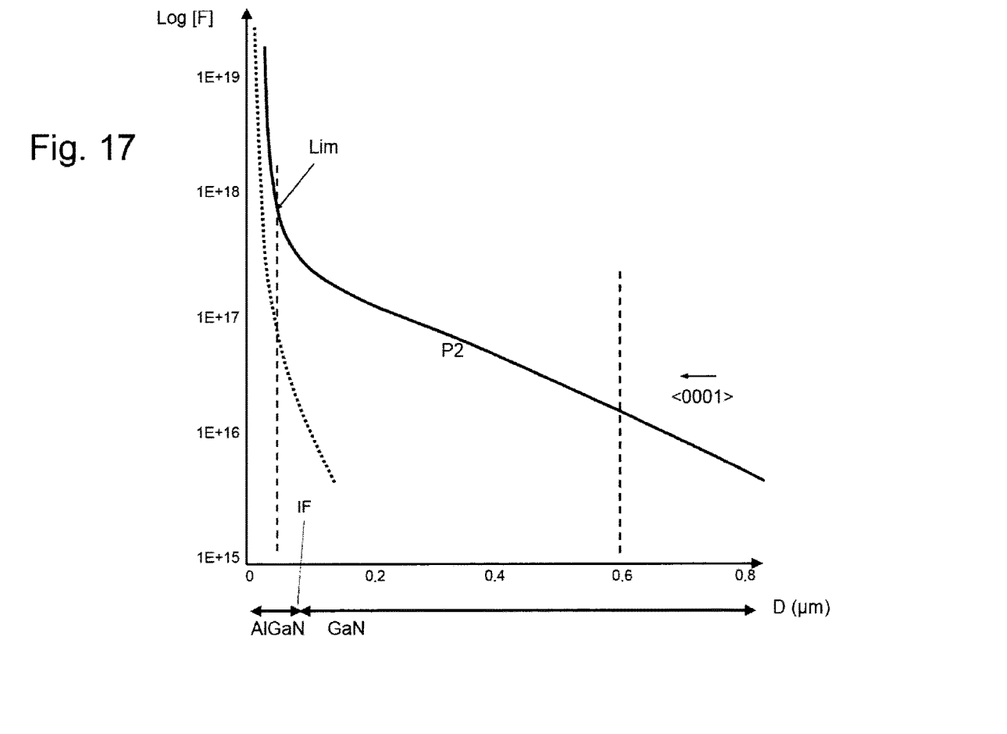
FIG. 17 is an example of a fluorine ion implantation graph.

Similar results have been obtained with implantation of fluorine: FIG. 17 is a graph of results obtained with an implantation energy of 5 keV, this graph allowing implantation with angles of 0° (solid line) and 7° (dotted line) to the [0001] direction of the crystal structure of the layer 4 to be compared. With an implantation angle of 0°, channeled implantation is observed, a high density being achieved in the layer 4 beyond a depth identified by the reference Lim. The dopant concentration implanted at a depth shallower than the depth Lim is clearly much higher with an implantation with an angle of 7° to the [0001] direction of the crystal structure of the layer 4.

Figure 4:
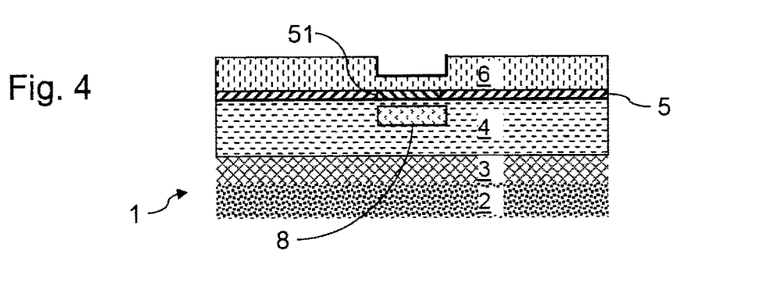

In FIG. 4, the layer 6 has advantageously been etched plumb with the implanted zone 8. This etching is carried out so as to remove the implanted zone 83 and to thin the thickness of the layer 6 plumb with the implanted zone 8. The location of the etch corresponds to the position in which the control gate of the transistor 1 will be formed. The trench formed during the etching allows the gate to be brought closer to the zone 51 in order to decrease the population of the electron gas by decreasing the effect of the polarization of the (for example: AlGaN) barrier layer. This makes it easier to obtain an enhancement mode or normally-off transistor. The distance between the bottom of the trench and the interface between the layers 4 and 6 is advantageously comprised between 5 and 10 nm. The mask 82 has also been removed, exposing the top side of the layer 6.

An insulating zone 51 is formed in the layer 5, plumb with the implanted zone 8. This zone 51 is made insulating by the presence of the electric field generated by the dopants of the implanted zone 8 and by the thinning of the layer 6. The transistor 1 is therefore turned off in the absence of a control signal applied to the gate.

An annealing step (at a temperature typically comprised between 1000 and 1400° C. for magnesium) is carried out allowing the dopants of the implanted zone 8 to be activated by enabling their positioning into the crystal structure of the layer 4, and allowing residual defects created in the crystal structure of the layers 4 and 6 by the implantation to be repaired.

When the implanted dopant is fluorine, the annealing step is replaced with a simple bake intended to repair residual defects generated in the crystal structure of the layers 4 and 6 by the implantation (bake at a temperature typically comprised between 400 and 800° C.).

Figure 5:
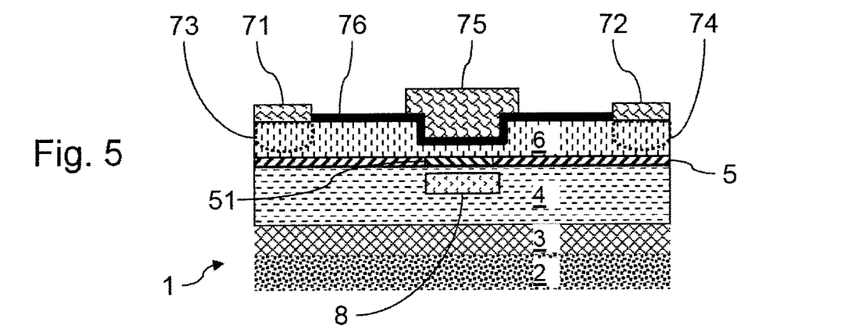

In FIG. 5, a source 71, a drain 72 and a gate 75 have been produced, in a way known per se, on the layer 6. An insulating layer 76 has been formed, in a way known per se, on the layer 6. The gate 75 has been formed on the insulating layer 76, inside the trench. The layer 5 is intended to ensure conduction between the source and drain when the transistor 1 is turned on. The control potential applied to the gate 75 defines whether the transistor 1 is off or on. The gate 75 may be of various types, for example of the Schottky or MIS (metal-insulator-semiconductors) type, without it being necessary to alter the structure of the transistor 1.

In order to promote on-state current density, the source 71 and the drain 72 may for example be connected to the layer 5 (illustrated by the junctions 73 and 74). The connection may be achieved in a way known per se by diffusing the metal of the source and drain into the layer 6, on the one hand, and via a tunneling effect with the layer 5, on the other hand. A metal of the source and drain, which is initially deposited on the layer 6, is for example diffused into the layer 6 in an annealing step. Such a metal may be Ti or Al, having a low work function. In the anneal, the Ti for example reacts with the GaN to form TiN. A highly doped region of a few nm in thickness is obtained, forming an ohmic contact via a tunneling effect with the layer 5. The layer 6 may optionally be thinned level with the source and drain by etching.

Figure 8:
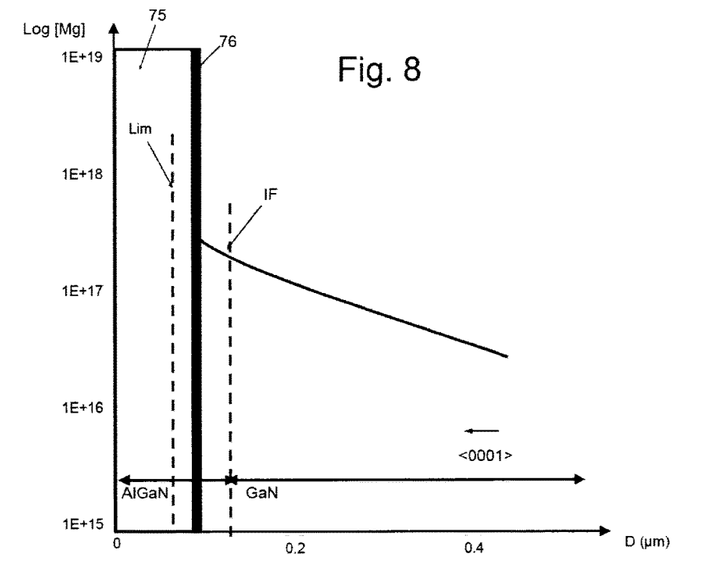
FIG. 8 is another example of a graph of dopant concentration after another step of the fabrication process.

FIG. 8 is a graph of the dopant concentration after the step of forming the gate 75. The implanted zone 83 corresponding to the Gaussian implantation is mainly replaced by the gate 75 and the insulator 76.

The fabrication process may of course be implemented differently. The implantation may for example be carried out prior to the formation of the gate, after the formation of a passivation layer.

It is also possible to envision carrying out the channeled implantation in the GaN layer 4, then forming a complement of the layer 4 by epitaxy, then forming the layer 6 by epitaxy.

It is also possible to envision carrying out the implantation in the GaN layer 4, removing the portion corresponding to the Gaussian implantation (by etching, or sublimation in the epitaxial chamber), this portion then being used as a sacrificial layer, then in depositing the layer 6 in order to only preserve the channeled implantation in the implanted zone 8 under the zone 51.

As the implantation progresses, defects accumulate in the crystal structure. The channeled implantation is limited by the appearance of crystal defects, which disrupt the regularity of the crystal channels. These disruptions impose an upper limit on the concentration of implanted ions. This upper limit is necessarily higher than the concentration of dopants in the implanted zone 8.

FIGS. 9 to 12 are schematic cross-sectional views of a heterojunction field-effect transistor 1, during various steps of another example of a fabrication process according to the invention.

Figure 9:
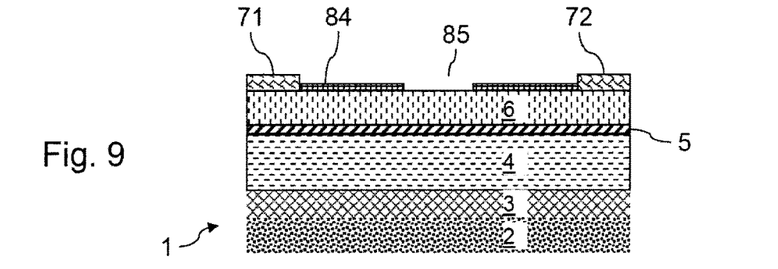
FIGS. 9 to 12 are cross-sectional views of a heterojunction field-effect transistor during various steps of another example of a fabrication process according to the invention.

FIG. 9 shows an unfinished transistor 1, comprising a substrate 2, a buffer layer 3 placed on the substrate 2, a first semiconductor layer 4 made of gallium nitride GaN placed on the buffer layer 3, a second III-V semiconductor layer 6 placed on the layer 4, and a mask 84 placed on the layer 6. An electron gas is intrinsically formed by the heterojunction at the interface between the layer 6 and the layer 4, and illustrated in the form of a layer 5 at the interface between the layer 4 and the layer 6. A source 71 and a drain 72 are formed on the layer 6. A dielectric passivation layer 84 is also formed on the layer 6. An aperture 85 is arranged in the passivation layer 84.

The substrate 2 is typically made of silicon and (111)-oriented silicon is preferably used. The buffer layer 3 deposited on the substrate 2 serves as an intermediary between this substrate 2 and the GaN first layer 4. The layer 4 may be formed in a way known per se by epitaxy on the buffer layer 3. The layer 4 formed has a hexagonal crystal structure with a [0001] direction making a normal to the upper surface of the substrate 2.

The layer 6 is typically a ternary group-III nitride alloy, AlGaN for example, having a [0001] direction making a normal to the upper surface of the substrate 2.

Figure 10:
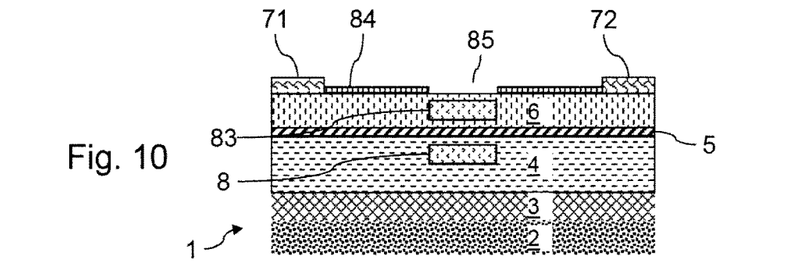

In FIG. 10, p-type dopants or highly electronegative ions have been implanted in the layer 4 through the aperture 85. The implantation is achieved by ion implantation of magnesium, calcium, zinc or fluorine. An implanted zone 8 is thus formed in the layer 4 and the implanted zone 83 is formed in the layer 6. The ion implantation is carried out in line with the [0001] direction of the crystal structure of the layer 4. Because of this implantation direction, the implantation of the dopants in the layer 4 is a channeled implantation.

Figure 11:
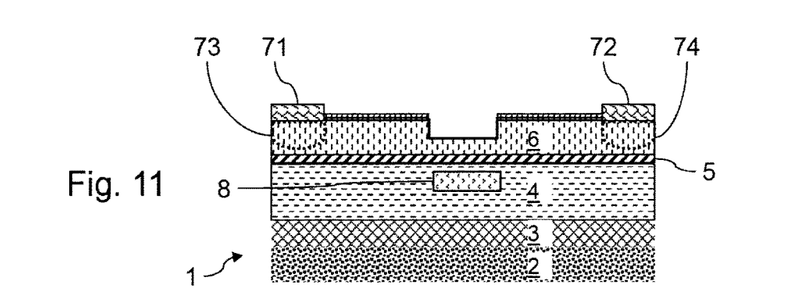

In FIG. 11, the layer 6 has advantageously been etched plumb with the implanted zone 8. The etching is carried out so as to remove the implanted zone 83 and thin the thickness of the layer 6 plumb with the implanted zone 8. The distance between the bottom of the trench and the interface between the layers 4 and 6 is advantageously comprised between 5 and 10 nm. The insulating zone 51 is formed in the layer 5, plumb with the implanted zone 8. An annealing step is carried out (for example at a temperature comprised between 1200 and 1400° C.). The source 71 and the drain 72 may for example be connected to the layer 5 (this being illustrated by the junctions 73 and 74) by diffusion of the metal of the source and drain into the layer 6 during the anneal, on the one hand, and by a tunneling effect with the layer 5, on the other hand.

Figure 12:
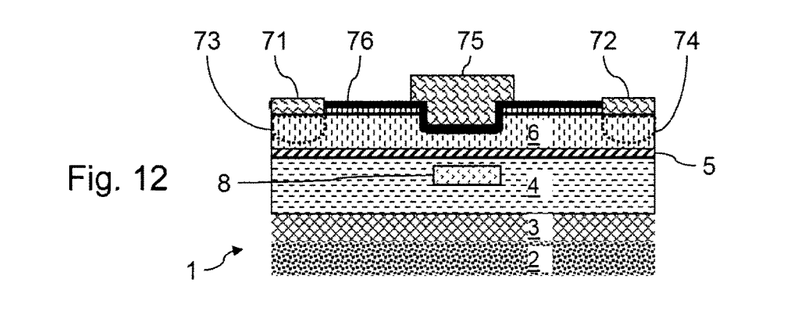

In FIG. 12, a dielectric layer 76 and a gate 73 have been produced in a way known per se, on the dielectric layer 76.

FIGS. 13 to 16 are schematic cross-sectional views of a hybrid heterojunction/MOSFET field-effect transistor 1, during various steps of an example of a fabrication process according to the invention. The transistor 1 is said to be hybrid because it comprises a semiconductor junction type channel and junctions between this channel and the source and the drain with conduction being achieved via an electron gas layer.

Figure 13:
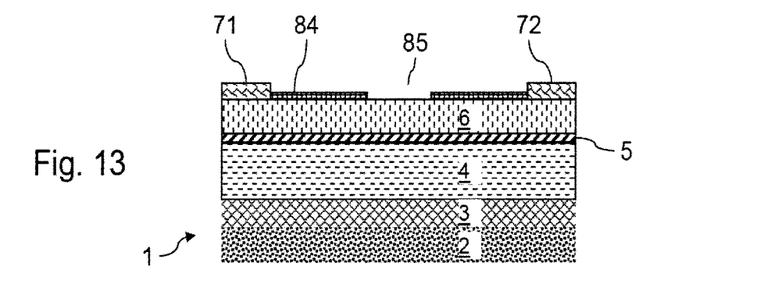
FIGS. 13 to 16 are cross-sectional views of another type of heterojunction field-effect transistor during various steps of one example of a fabrication process according to the invention.

FIG. 13 shows an unfinished transistor 1, comprising a substrate 2, a buffer layer 3 placed on the substrate 2, a first semiconductor layer 4 made of gallium nitride GaN placed on the buffer layer 3 and a second III-V semiconductor layer 6 placed on the layer 4. An electron gas is intrinsically formed by the heterojunction at the interface between the layer 6 and the layer 4, and illustrated in the form of a layer 5 at the interface between the layer 4 and the layer 6. A source 71 and a drain 72 are formed on the layer 6. A dielectric passivation layer 84 is also formed on the layer 6. An aperture 85 is arranged in the passivation layer 84.

The substrate 2 is typically made of silicon and (111)-oriented silicon is preferably used. The buffer layer 3 deposited on the substrate 2 serves as an intermediary between this substrate 2 and the GaN first layer 4. The layer 4 may be formed in a way known per se by epitaxy on the buffer layer 3. The layer 4 formed has a hexagonal crystal structure with a [0001] direction making a normal to the upper surface of the substrate 2.

The layer 6 is typically a ternary group-III nitride alloy, AlGaN for example, having a [0001] direction making a normal to the upper surface of the substrate 2.

Figure 14:
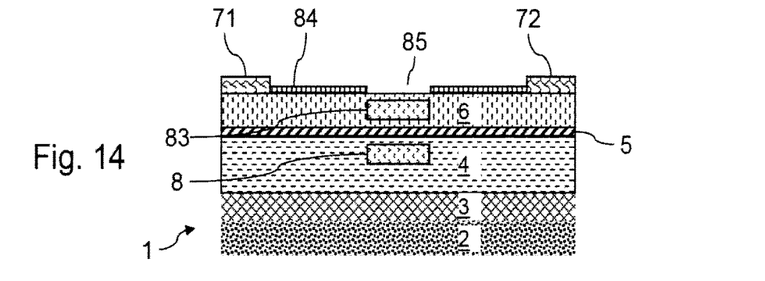

In FIG. 14, p-type dopants have been implanted in the layer 4 through the aperture 85. The implantation is achieved by ion implantation of magnesium, calcium or zinc. An implanted zone 8 is thus formed in the layer 4 and an implanted zone 83 is formed in the layer 6. The ion implantation is carried out in line with the [0001] direction of the crystal structure of the layer 4. Because of this implantation direction, the implantation of the dopants in the layer 4 is a channeled implantation.

Figure 15:
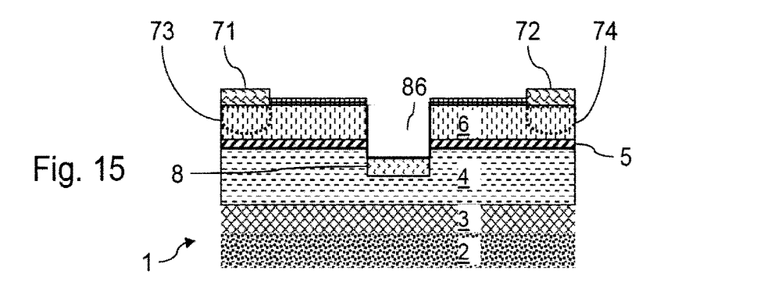

In FIG. 15, etching through the layer 6 and as far as into the layer 4 has been carried out plumb with the implanted zone 8. The trench 86 formed by this etching advantageously extends as far as into the implanted zone 8. The electron gas layer 5 is therefore interrupted level with this trench.

An annealing step is carried out (for example at a temperature comprised between 1000 and 1400° C.). The source 71 and the drain 72 may for example be connected to the layer 5 (this being illustrated by the junctions 73 and 74) by diffusion of the metal of the source and drain into the layer 6 during the anneal, on the one hand, and by a tunneling effect with the layer 5, on the other hand.

Figure 16:
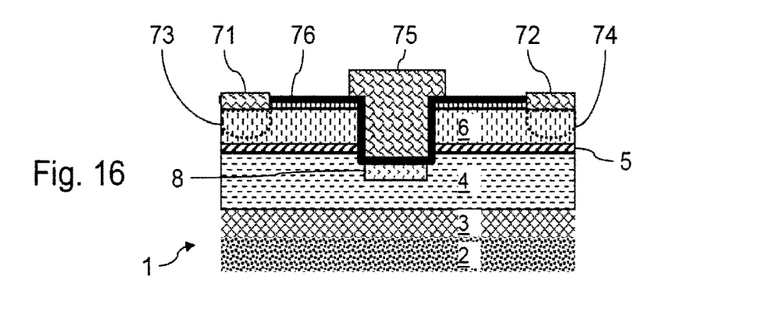

In FIG. 16, a dielectric layer 76 has been deposited covering the walls and bottom of the trench 86 and a gate 73 has been deposited on the dielectric layer 76. A gate stack 75 is then deposited in a way known per se on the dielectric layer 76 and in the trench.

The transistor 1 thus comprises a channel formed in the implanted zone 8 plumb with the gate 75. Conduction in this channel is therefore achieved by way of a semiconductor effect, depending on the field applied by the gate 75. A low resistance is obtained in the on state of the transistor 1, because of conduction in the electron gas layer 5 between the channel and the source 71 and the drain 72

The invention claimed is:

1. A heterojunction transistor fabrication process, comprising:
    forming a first semiconductor layer of gallium nitride of hexagonal crystal structure;
    forming a second semiconductor layer on the first semiconductor layer so as to form an electron gas layer at an interface between the first and the second semiconductor layers; then
    forming an implanted zone in the first semiconductor layer and an implanted zone in the second semiconductor layer by ion implanting magnesium, calcium, zinc or fluorine in the first semiconductor layer and the second semiconductor layer, wherein the ion implanting is in line with the [0001] direction of the gallium nitride hexagonal crystal structure, wherein the forming the implanted zone in the second semiconductor layer by the ion implanting induces an implantation density peak with a Gaussian distribution thicknesswise in the implanted zone of the second semiconductor layer;
    removing the implanted zone of the second semiconductor layer having the implantation density peak with the Gaussian distribution, and
    forming a control gate above the second semiconductor layer plumb with the implanted zone of the first semiconductor layer.

2. The process of claim 1, further comprising activation annealing the implanted zone of the first semiconductor layer.

3. The process of claim 1, wherein the first semiconductor layer is formed on a silicon substrate having a (111) crystal orientation.

4. The process of claim 1, wherein an ion implantation energy of the ion implanting ranges from 1 to 10 keV.

5. The process of claim 1, wherein the formation of the second semiconductor layer comprises growing the second semiconductor layer by epitaxy.

6. The process of claim 1, wherein:
    the second semiconductor layer has a hexagonal crystal structure; and
    the forming the implanted zone in the second semiconductor layer by ion implanting occurs in line with a [0001] direction of the hexagonal crystal structure of the second semiconductor layer.

7. The process of claim 1, wherein the second semiconductor layer formed is a binary group-III nitride alloy.

8. The process of claim 1, wherein the second semiconductor layer formed is a ternary group-III nitride alloy.

9. The process of claim 1, wherein the implanted zone in the first semiconductor layer is formed by ion implanting magnesium in the first semiconductor layer and the implanted zone in the first semiconductor layer has a magnesium density ranging from $10^{16}$ to $10^{19}$ cm$^{-3}$ over a thickness at least equal to 15 nm starting from the interface between the first and second semiconductor layers.

10. The process of claim 1, wherein the implanted zone in the first semiconductor layer includes at least 30% of a total amount of dopant introduced during the forming the implanted zone in the first semiconductor layer by ion implanting.

11. The process of claim 1, wherein the second semiconductor layer has a [0001] direction coincident with the [0001] direction of the first semiconductor layer.

12. The process of claim 1, wherein the forming the implanted zone in the first semiconductor layer by ion implanting is carried out by ion implanting the magnesium, the calcium, the zinc or the fluorine at an angle smaller than or equal to 2° to the [0001] direction of the first semiconductor layer.

13. The process of claim 1, wherein the forming the implanted zone in the first semiconductor layer by ion implanting the magnesium, the calcium, the zinc or the fluorine is carried out at an angle smaller than or equal to 1° in the [0001] direction of the first semiconductor layer.

14. The process of claim 1, wherein the forming the implanted zone in the first semiconductor layer by ion implanting the magnesium, the calcium, the zinc or the fluorine includes ion implanting at an implantation energy of between 1 and 10 keV.

15. The process of claim 1, wherein the forming the implanted zone in the first semiconductor layer by ion implanting the magnesium, the calcium, the zinc or the fluorine is carried out at an implantation energy of between 1 and 5 keV.

16. The process of claim 1, wherein the forming the implanted zone in the first semiconductor layer by ion implanting the magnesium, the calcium, the zinc or the fluorine is carried out at an implantation energy of between 5 and 10 keV.

17. The process of claim 1, wherein the forming the implanted zone in the second semiconductor layer by ion implanting is carried out in line with a [0001] direction of the crystal structure of the second semiconductor layer by orienting the ion implanting less than 1° to the [0001] direction of the crystal structure of the first and the second semiconductor layers.

18. The process of claim 17, wherein the second semiconductor layer is AlGaN.

\* \* \* \* \*